United States Patent [19]

Timpe et al.

[11] Patent Number: 5,698,360
[45] Date of Patent: Dec. 16, 1997

[54] SULFONAMIDO SUBSTITUTED ACETAL POLYMERS AND USE THEREOF IN PHOTOSENSITIVE COMPOSITIONS AND LITHOGRAPHIC PRINTING PLATES

[75] Inventors: Hans-Joachim Timpe, Osterode; Udo Dwars, Herzberg; Harald Baumann, Osterode; Celin Savariar-Hauck, Badenhausen, all of Germany

[73] Assignee: Sun Chemical Corporation, Fort Lee, N.J.

[21] Appl. No.: 677,703

[22] Filed: Jul. 10, 1996

[30]  Foreign Application Priority Data

Jul. 10, 1995  [DE]  Germany ............ 195 25 050.8

[51] Int. Cl.[6] .......................................... G03F 7/021
[52] U.S. Cl. ................... 430/175; 430/157; 430/176; 430/281.1; 430/302
[58] Field of Search ........................ 430/175, 176, 430/157, 281.1, 302

[56]  References Cited

U.S. PATENT DOCUMENTS

| | | | |
|---|---|---|---|
| 2,179,051 | 11/1939 | Morrison et al. | 260/73 |
| 3,732,106 | 5/1973 | Steppan et al. | 96/115 |
| 4,123,276 | 10/1978 | Kita et al. | 96/91 |
| 4,177,073 | 12/1979 | Hata et al. | 430/188 |
| 4,304,832 | 12/1981 | Ohta et al. | 430/175 |
| 4,355,096 | 10/1982 | Walls | 430/302 |
| 4,387,151 | 6/1983 | Bosse et al. | 430/175 |
| 4,511,640 | 4/1985 | Liu | 430/157 |
| 4,618,562 | 10/1986 | Walls et al. | 430/157 |
| 4,631,245 | 12/1986 | Pawlowski | 430/175 |
| 4,665,124 | 5/1987 | Walls et al. | 430/175 |
| 4,687,727 | 8/1987 | Toyama et al. | 430/175 |
| 4,731,316 | 3/1988 | Tomiyasu et al. | 430/157 |
| 4,741,985 | 5/1988 | Aoai et al. | 430/175 |
| 4,774,161 | 9/1988 | Sekiya et al. | 430/175 |
| 4,840,868 | 6/1989 | Pawlowski et al. | 430/155 |
| 4,877,711 | 10/1989 | Aoai et al. | 430/176 |
| 4,940,646 | 7/1990 | Pawlowski | 430/176 |
| 4,950,582 | 8/1990 | Aoai et al. | 430/175 |
| 4,983,491 | 1/1991 | Aoai et al. | 430/175 |
| 5,112,743 | 5/1992 | Kamiya | 430/175 |
| 5,143,813 | 9/1992 | Joerg | 430/162 |
| 5,169,897 | 12/1992 | Walls | 525/61 |
| 5,176,985 | 1/1993 | Seitz et al. | 430/284 |
| 5,187,040 | 2/1993 | Mueller-Hess et al. | 430/157 |
| 5,206,113 | 4/1993 | Mueller-Hess et al. | 430/270 |
| 5,219,699 | 6/1993 | Walls et al. | 430/176 |
| 5,238,772 | 8/1993 | Mueller-Hess et al. | 430/175 |
| 5,260,161 | 11/1993 | Matsumura et al. | 430/161 |
| 5,262,270 | 11/1993 | Walls | 430/175 |
| 5,275,907 | 1/1994 | Walls | 430/176 |
| 5,316,892 | 5/1994 | Walls et al. | 430/175 |
| 5,534,381 | 7/1996 | Ali et al. | 430/175 |

FOREIGN PATENT DOCUMENTS

| | | |
|---|---|---|
| 0 487 343 | 5/1992 | European Pat. Off. . |
| 0 544 264 | 6/1993 | European Pat. Off. . |
| 3907820 | of 0000 | Germany . |
| 2 007 677 | 5/1979 | United Kingdom . |

OTHER PUBLICATIONS

H. Baumann, H.J. Timpe, "Chemical Aspects of Offset Printing" in Journal für praktische Chemie Chemiker-Zeitung [Journal for Chemists] 336 (1994) pp. 377–389.

*Primary Examiner*—John S. Chu
*Attorney, Agent, or Firm*—Sidney Persley

[57]  ABSTRACT

The present invention relates to binders and photosensitive compositions comprising said binders. The binder comprises units A, B, C and D, wherein A is present in an amount of 0.5 to 15 wt. % and is of the formula

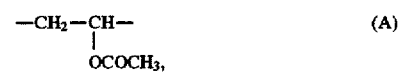

B is present in an amount of 10 to 35 wt. % and is of the formula

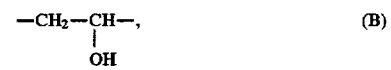

C is present in an amount of 10 to 50 wt. % and is of the formula

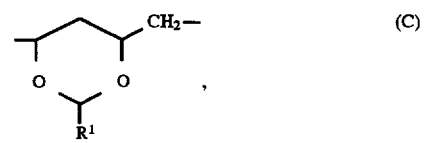

wherein $R^1$ is methyl, ethyl, propyl or isopropyl, and D is present in an amount of 25 to 70 wt. % and is of the formula

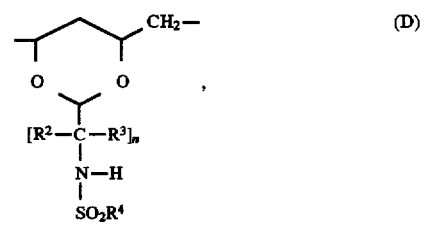

wherein n is an integer of from 1 to 3 and $R^2$, $R^3$ are hydrogen or methyl and $R^4$ is alkyl, aralkyl or aryl.

4 Claims, No Drawings

SULFONAMIDO SUBSTITUTED ACETAL POLYMERS AND USE THEREOF IN PHOTOSENSITIVE COMPOSITIONS AND LITHOGRAPHIC PRINTING PLATES

FIELD OF THE INVENTION

The present invention relates to binders and photosensitive compositions comprising said binders and inter alia excellently suitable for the production of lithographic plates.

BACKGROUND OF THE INVENTION

Nowadays, photosensitive compositions usable particularly for high-performance lithographic plates must fulfill high requirements.

The discussion of improving the properties of photosensitive compositions and thus also of the corresponding lithographic plates essentially deals with two different ways. One of them deals with the improvement of the properties of the photosensitive components in the compositions (frequently negative diazo resins, photo polymers etc.), the other one with the search for novel polymeric compounds ("binders") which are to control the physical properties of the photosensitive layers. In particular the latter way is decisive for lithographic plates because the behavior in the developing and printing processes (such as developability, ink receptivity, scratch resistance, consistency in the number of prints produced) is decisively influenced by the polymeric binders. Also shelf life and photosensitivity of the materials are strongly influenced by the polymeric compounds.

The polymeric binders therefore exhibit various structural elements for satisfying the extensive requirements, which may have different effects on individual properties. For instance, hydrophilic structural elements such as carboxyl groups, hydroxyl groups and the like generally promote the developability of the photosensitive compositions in aqueous alkaline developers and partly ensure sufficient adhesion to polar substrates. Hydrophobic structural elements, on the other hand, reduce the capability of being developed in the above-mentioned developers, but ensure the good ink receptivity used in the printing process, which is indispensable in lithographic plates.

Due to the broad range of requirements regarding the polymeric binders, for many years there have been extensive studies on the synthesis and optimization of these substances for photosensitive compositions, cf. e.g. H. Baumann and H. J. Timpe: "Chemical Aspects of Offset Printing" in *J. prakt. Chem./Chemiker-Zeitung* [Journal for chemists] 336 (1994) pages 377–389.

U.S. Pat. Nos. 4,511,640 and 4,618,562 and U.S. Pat. No. 4,731,316 describe binder systems consisting of compositions of polymers having different hydrophilic/hydrophobic properties. However, such compositions involve the disadvantage that very frequently incompatibilities between the different substances lead to separation during the formation of layers. Furthermore, it was found that the hydrophobic polymers precipitate during the developing process in the processing of the lithographic plates, which may lead to silting in the developing machines and to re-deposition of dispersed layer portions on the surface of the photosensitive material.

Furthermore, copolymers consisting of only slightly hydrophilic monomers such as styrene, acrylic acid ester, methacrylic acid ester and the like With hydrophilic comonomers were described. Examples of such comonomers are semi-esters of maleic acid (Canadian Patent 1172 442, U.S. Pat. No. 4,687,727), itaconic acid (U.S. Pat. No. 5,260,161) and acrylic acid and/or methacrylic acid (EP-A-487 343, U.S. Pat. No. 4,304,832, U.S. Pat. No. 4,123,276). The very tight play of the properties important for the use, which are layer adhesion, developability and printing ink receptivity proved to be disadvantageous in such polymers. Variations in the polymers' composition can hardly be avoided during the production process, which leads to unacceptable fluctuations in the plates' properties.

U.S. Pat. No. 4,177,073 describes photosensitive compositions, wherein the binder is a reaction product of cellulose esters with cyclic, intramolecular acid anhydrides of dicarboxylic acids. These binders, however, are not oleophilic enough for the use in lithographic plates formulations.

Another group of binders described are acetals of aliphatic aldehydes with low alkyl group and vinyl alcohol/vinyl acetate copolymers (U.S. Pat. Nos. 2,179,051, 4,665, 124). However, such binders cause problems in the developing of lithographic plates due to the fact that there are not enough hydrophilic groups in the polymer. To improve this, partially acetalized vinyl alcohol/vinyl acetate copolymers were provided with alkali-soluble groups by means of special reactions (U.S. Pat. Nos. 4,387,151, 3,732, 106, 3,372,105, 4,631,245, 4,840,868, 4,741,985, 4,774,161, 5,169,897, 4,940,646, 5,143,813 and U.S. Pat. No. 5,219, 699). Especially preferred, carboxyl and sulfonyl urethane groups were inserted into the polymers to achieve the desired developability parameters. The insertion of the acidic carboxyl group into the side chain of the polyvinyl acetals, however, may lead to ink receptivity problems, particularly when alkaline wetting agents are used in the printing process. In the case of sulfonyl urethane containing binders, this disadvantage is almost entirely prevented; however, the production of such binders involves considerable effort and is rather costly.

Polymers that contain urethane groups were also described as binders for photosensitive compositions (U.S. Pat. Nos. 5,206,113, 5238,772, 5,187,040, 5,176,985, 4,983, 491, 4,950,582, 4,877,711). These polyurethane resins contain functional groups (—COOH, —SO$_2$NHCOO—, —CONHSO$_2$NH—) with an acidic hydrogen atom, the pK$_a$ values in water of which are no higher than 7. The necessary functionalisation with such hydrophilic groups, however, requires very high efforts regarding synthesis and involves high costs.

Despite this intensive research carried out in the field of photosensitive compositions for lithographic plates, all existing compositions make improvement appear desirable, in particular regarding their developability and their sensitivity towards pressure chamber chemicals. Furthermore, many of the compositions exhibit a high number of partially rather expensive components, which make an economical use impossible.

It is thus the object of this invention to provide binders and photosensitive compositions comprising said binders and doing with as few components as possible vis-a-vis the compositions described in the state of the art (which makes them economically desirable) and still having the same or—in individual areas—improved physical properties. In particular, an improved printing ink receptivity and/or an increased number of prints produced from the corresponding lithographic plates vis-a-vis the compositions described in the state of the art are to be achieved, while maintaining the good developability in developers containing only low amounts of organic solvents, salts and wetting agents, the high photosensitivities and the good resolution, and which, in addition, are compatible with the other products used in the processing of lithographic plates.

Another object underlying this invention is the use of such photosensitive compositions for preparing lithographic plates.

SUMMARY OF THE INVENTION

These objects are achieved by a photosensitive composition comprising:

(i) a diazonium polycondensation product or a free radical polymerizable system consisting of photoinitiators and unsaturated compounds which are free radical polymerizable or a hybrid system consisting of a diazonium polycondensation product and a free radical polymerizable system consisting of photoinitiators and unsaturated compounds which are free radical polymerizable, (ii) a binder and optionally one or more exposure indicator(is), one or more dye(is) for increasing the contrast of the image as well as one or more acid(is) for stabilizing the photosensitive composition, characterized in that the binder is a reaction product of units A, B, C and D, wherein A is present in an amount of 0.5 to 15 wt. % and is of the formula

(A)

B is present in an amount of 10 to 35 wt. % and is of the formula

(B)

C is present in an amount of 10 to 50 wt. % and is of the formula

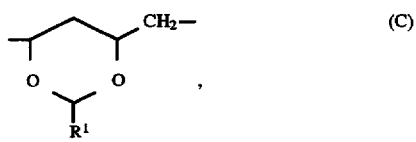
(C)

wherein $R^1$ is methyl, ethyl, propyl or isopropyl, and D is present in an amount of 25 to 70 wt. % and is of the formula

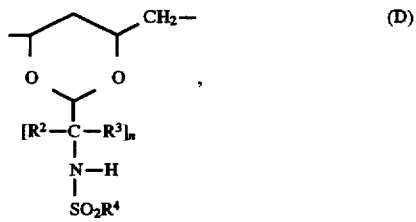
(D)

wherein n is an integer of from 1 to 3 and
$R^2$, $R^3$ are hydrogen or methyl and
$R^4$ is alkyl, aralkyl or aryl.

DESCRIPTION OF THE INVENTION

The surprising advantages of the invention are that by means of a rather simple synthesis and starting from inexpensive vinyl alcohol/vinyl acetate copolymers available in large-scale technology, specific polymers can be prepared in one synthesis step. The properties of the thus obtained polymers can be exactly adjusted by varying the molecular mass and the degree of saponification of the vinyl alcohol/vinyl acetate copolymers as well as the kind of substituents in the second starting product, a low-molecular sulfonamido-substituted acetal. This way, tailor-made polymers can be obtained suitable for the use in photosensitive composition based on various photo-crosslink mechanisms. The developability of such compositions using conventional developers, in particular developers used in processing offset lithographic plates, could be considerably improved without causing any ink receptivity problems.

The vinyl alcohol/vinyl acetate copolymers serving as starting material for the production of the polymers of this invention are 80 to 98 mole % hydrolyzed and have a weight-average molecular mass $M_w$ of 20,000 to 130,000 g/mole. Suitable copolymers of this type are commercially available.

Which copolymer is used as starting material for the synthesis depends on the intended use of the photosensitive composition. In an application for the production of offset lithographic plates, polymers having a weight-average molecular mass $M_w$ of 35,000 to 130,000 g/mole and a degree of hydrolysis of the vinyl acetate structural unit of 80 to 98 mole % are preferably used.

The production of the polymeric binders of this invention takes place in two synthesis steps. In a first step sulfonamides are produced from amino-substituted aliphatic acetals. Such compositions have not been known so far. They may be obtained, e.g., by sulfonamide synthesis processes from sulfochlorides and amino-substituted acetals of aliphatic aldehydes.

Reactions in dry pyridine or aqueous sodium carbonate solution have proven to be particularly useful for the production of the sulfonamide acetals. In the latter case, a 0.05 to 0.10 molar surplus of sulfochloride is used to replace the portion separated by hydrolysis. The choice of solvent mixture used depends on the hydrolysis susceptibility of the shlfochloride. In case of readily hydrolyzing sulfochlorides, such as methane sulfochloride, pyridine is used. The temperatures of the reaction mixtures should be between 10° and 15° C. at the beginning and must be increased to 40° to 50 ° C. towards the end to achieve a complete reaction. When working in an aqueous medium, the sulfonamide acetals are oily viscous substances that can easily be extracted by shaking with extraction agents such as diethyl ether, dichloromethane or toluene. After the extraction agent has been distilled off, if necessary applying a vacuum, the sulfonamide acetal is isolated. Some of the products crystallize after standing for an extended time at room temperature. In the case of the reactions in pyridine, the reaction mixture is poured into ice water that contains enough hydrochloric acid to bind the majority of the pyridine in the form of pyridinium hydrochloride. Then too the sulfonamide acetal is obtained in the above-mentioned form and may be isolated.

The aliphatic amino-substituted acetals necessary for the synthesis and the sulfochlorides are commercially available products. The moieties $R^2$ and $R^3$ in the amino-substituted acetals are as defined above. Alkyl, preferably methyl, aryl, preferably phenyl, aralkyl, preferably tolyl, alkoxy aryl or alkanoyl amide aryl groups are suitable organic moieties $R^4$ in the sulfochlorides. More preferred are alkoxy aryl, such as methoxy phenyl, and alkanoyl amide aryl, such as acetamido phenyl groups. In these groups, all aliphatic moieties have preferably 1 to 8, more preferably 1 to 3, carbons. The aryl moieties have preferably 6 or 10, more preferably 6 carbons.

The reactions between the aliphatic amino-substituted acetals and the sulfochlorides proceed in a very controlled and, in most cases, quantitative manner and can easily be reproduced. Thus, the sulfonamide acetals can be used for the production of the polymeric binders of this invention without further purification steps.

In the second step of the production of the polymeric binders of this invention vinyl alcohol/vinyl acetate copolymers, the above-mentioned sulfonamide acetals and aliphatic aldehydes are reacted to form polyvinyl acetals. This reaction takes place according to known standard methods for polyvinyl acetal synthesis in the presence of catalytic amounts of a mineral acid; examples are described in.

The reaction can either take place in an organic solvent for the vinyl alcohol/vinyl acetate copolymers more preferred is dimethyl sulfoxide, or in water in the presence of a surfactant or in a mixture of water and a hydroxyl group containing solvent such as ethanol, n-propanol or isopropanol, more preferred is an n-propanol/water mixture (2/1 wt. parts). The reaction is usually carried out at temperatures of from 50° to 70° C. and with reaction times between 5 and 7 hours. The concentration of the reaction partners based on the amount of solvent is 10 to 18 wt. %, more preferred are 14 wt. %. The catalytic amount of added mineral acid is between 0.75 and 1.5 wt. %. This amount of mineral acid must be neutralized upon termination of the reaction by adding molar amounts of an alkaline salt such as, e.g., sodium and potassium carbonate in order to prevent an acidically catalyzed deacetalisation of the polymeric binders during storage or later use. Sodium or potassium hydroxide are also suitable for neutralisation. The total amount of aliphatic aldehyde and sulfonamide acetal used is chosen such that the degree of acetalisation of the vinyl alcohol/vinyl acetate copolymers is between 50 and 90 wt. %.

Acetaldehyde, propionaldehyde or butyraldehyde are preferred aliphatic aldehydes for the acetalisation of the copolymers. Especially preferred is propionaldehyde. The amount of aldehyde used based on the sulfonamide acetal is 10 to 90 wt. %. In general, the developability of a photosensitive composition comprising the polymeric binders of this invention deteriorates as the aliphatic aldehyde therein increases. But also the total degree of acetalisation, the molecular mass and the degree of hydrolysis of the starter copolymers as well as the substituents in the sulfonamide acetals determine the developability of such compositions.

In the production of the binders of this invention in organic solvents or hydroxyl groups containing solvent/water mixtures, the end products are precipitated by stirring into water. The precipitation procedure can also take place in that water is stirred into the reaction mixture. In both cases the mixing must be intensive in order to obtain a reaction product that is good to handle and to separate the also resulting side products as quantitatively as possible.

When the reaction takes place in water, the product separates in the course of the reaction. In both cases, the precipitated reaction product is separated, washed with water followed by drying using hot air of 45° to 50° C. until the water content is no more than 1 wt. %.

The second essential component of the photosensitive composition of this invention is a diazonium polycondensation product or a free radical polymerizable system, consisting of photoinitiators and unsaturated compounds, which are free radical polymerizable, or a hybrid system comprising a diazonium polycondensation product and a free radical polymerizable system comprising photoinitiators and unsaturated compounds which are free radical polymerizable.

In the photosensitive mixtures according to the invention, diazonium polycondensation products known to the person skilled in the art can be used as diazonium polycondensation product. Such condensation products may for instance be prepared in a common manner by condensation of a diazo monomer described in U.S. Pat. No. 4,67,727 with a condensation agent, such as formaldehyde, acetaldehyde, propionaldehyde, butyraldehyde, isobutyraldehyde or benzaldehyde. Furthermore, mixed condensation products are used which, apart from the diazonium salt units, comprise other non-photosensitive units which are derived from condensable compounds, in particular from aromatic amines, phenols, phenol ethers, aromatic thioethers, aromatic hydrocarbons, aromatic heterocycles or organic acid amides. Especially advantageous examples of diazonium polycondensation products are reaction products of diphenylamine-4-diazonium salts, optionally having a methoxy group in the phenyl group bearing the diazo group, with formaldehyde or 4,4'-bis-methoxymethyl diphenyl ether. Aromatic sulfonates such as 4-tolylsulfonate or mesitylene sulfonate, tetrafluoroborate, hexafluoroborate, hexafluorophosphate, hexafluoroantimonate or hexafluoro-arsenate are particularly suitable as anions of these diazo resins. The diazonium polycondensation product is preferably present in the photosensitive mixtures in an amount of from 3 to 60 wt. %.

The second substantial component may also be a free radical polymerizable system. This is made up of photoinitiators absorbing in the range of from 300 to 800 nm, preferably 300 to 450 nm, and free radical polymerizable components. The basic bodies and/or derivatives of acetophenone, benzophenone, 2,4-(trichloromethyl)-1,3,5-triazine, benzoine, benzoine ethers, benzoine ketales, xanthone, thioxanthone, acridine or hexaryl-bis-imidazole are preferred photoinitiators for the photosensitive compositions of this invention. The free radical polymerizable component of the mixture of this invention is an acrylic or methacrylic acid derivative having one or more unsaturated group(is), preferably esters of acrylic or methacrylic acid in the form of monomers, oligomers or prepolymers. It may be present in solid or liquid form, solid and highly viscous forms being preferred. The compounds suitable as monomers include for instance trimethylol propane triacrylate and methacrylate, pentaerythrite triacrylate and methacrylate, dipentaerythritol-monohydroxy pentaacrylate and methacrylate, dipentaerythritol-hexaacrylate and methacrylate, pentaerythritol tetraacrylate and methacrylate, ditrimethylol propane tetraacrylate and methacrylate, diethylene glycol diacrylate and methacrylate, triethylene glycol diacrylate and methacrylate or tetraethylene glycol diacrylate and methacrylate. Suitable oligomers and/or prepolymers are urethane acrylate and methacrylate, epoxide acrylate and methacrylate, polyester acrylate and methacrylate, polyether acrylate and methacrylate or unsaturated polyester resins. The photoinitiators and free radical polymerizable components are to be arranged in a manner known to the person skilled in the art, combinations of various photoinitiators and different free radical polymerizable components being also advantageous. The weight ratio of the photoinitiators is preferably 0.5 to 20% and that of the free radical polymerizable component 5 to 80%, based on the total solids content of photosensitive composition.

A combination of the diazonium polycondensation products having a free radical polymerizable system comprising photoinitiators and unsaturated compounds, which are free radical polymerizable, may be advantageous for certain applications. The compositions of such hybrid systems preferably comprise 1 to 50 wt. % diazonium polycondensation products, 0.5 to 20 wt.% photoinitiators as well as 5 to 80 wt. % free radical polymerizable components.

The exposure indicators usable in the photosensitive mixtures of this invention are known to the person skilled in the art. Exposure indicators from the group of triaryl methane dyes (such as Victoria blue BO, Victoria blue R, Crystal Violet) or azo dyes (such as 4-phenyl-azo-diphenylamine, azobenzene or 4-N,N-dimethyl-amino-azo-benzene) are preferred. The exposure indicators are present in the photosensitive mixture at a ratio of 0.02 to 10 wt. %, preferably 0.5 to 6 wt. %.

Suitable dyes for improving the contrast of the image are those that dissolve well in the solvent or solvent mixture used for coating or are easily introduced in the disperse form of a pigment. Suitable contrast dyes include inter alia rhodamin dyes, methyl violet, anthrachinone pigments and phthalocyanine dyes and/or pigments. The dyes are present in the photosensitive composition in an amount of 1 to 15 wt. %, preferably 2 to 7 wt. %.

Furthermore, the mixture of this invention may comprise stabilizing acids. These stabilizing acids include phosphoric, citric, benzoic, m-nitrobenzoic, p-anilino azo-benzene sulfonic, p-toluene sulfonic or tartaric acid. In some formulations a mixture of several different acids is advantageous. Phosphoric acid is preferably used as stabilizing acid. The added acid preferably amounts to 0.2 to 3 wt. %.

The photosensitive mixture of this invention may also comprise a softening agent. Suitable softening agents include dibutyl phthalate, triaryl phosphate and dioctyl phthalate. Dioctyl phthalate is especially preferred. The amount of softening agent used is, preferably 0.25 to 2 wt. %.

The photosensitive mixtures of this invention are preferably usable for producing lithographic plates. In addition, however, they may be used in recording materials for creating images on suitable carriers and receiving sheets, for creating reliefs that may serve as printing molds, screens and the like, as light-hardening varnishes for surface protection and for the formulation of UV-hardening printing inks.

For the preparation of planographic printing plates aluminum as the carrier is first toughened by brushing in a dry state, brushing with abrasive suspensions or electrochemically, e.g. in an hydrochloric acid electrolyte. The roughened plates, which were optionally anodically oxidized in sulfuric or phosphoric acid, are then subjected to a hydrophilizing aftertreatment, preferably in an aqueous solution of polyvinyl phosphonic acid, sodium silicate or phosphoric acid. The details of the above-mentioned substrate pretreatment are well-known to the person skilled in the art.

The dried plates are then coated with the photosensitive layers of organic solvents and/or solvent mixtures such that dry layer weights of preferably from 0.5 to 4 g/m², more preferably 0.8 to 3 g/m², are obtained.

In some cases the additional application of an oxygen-impermeable top layer to the photosensitive layer might be advantageous. This is especially advantageous in free radical polymerizable systems and in the hybrid systems of diazonium polycondensation products and free radical polymerizable systems. The polymers suitable for the top layer include polyvinyl alcohol, polyvinyl alcohol/polyvinyl acetate copolymers, polyvinyl pyrrolidone, polyvinyl pyrrolidone/polyvinyl acetate copolymers, polyvinyl methyl ether, polyacrylic acid and gelatine. The weight of the oxygen-impermeable top layer is preferably 0.1 to 4 g/m², and more preferably 0.3 to 2 g/m².

The thus produced lithographic plates are exposed and developed as common and known to the person skilled in the art. The developed plates are usually treated with a preservative ("rubber coating"). The preservatives are aqueous solutions of hydrophilic polymers, wetting agents and other additives.

For certain uses it is furthermore advantageous to increase the mechanical strength of the printing layers by means of a heat treatment or a combined use of heat and UV radiation. For this purpose, the plate is first treated with a solution that protects the non-image areas such that the heat treatment will cause no ink receptivity in these areas. A suitable solution is described e.g. in U.S. Pat. No. 4,355,096.

The following examples serve to provide a more detailed explanation of the invention and are not intended to limit the scope thereof in any respect and should not be so construed.

PREPARATION EXAMPLE 1

Preparation of benzene sulfonamido acetaldehyde dimethyl acetal 56 g 2-aminoacetaldehyde dimethyl acetal are dissolved in 200 ml of a 14 wt. % aqueous sodium carbonate solution at 20 ° C. in a three-necked flask, equipped with a thermometer, reflux condenser, tap funnel and magnetic stirrer. Subsequently, 88 g benzene sulfochloride are added drop-wise within 1 hour at this temperature under intensive stirring followed by another 2 hours of heating the reaction to 40° to 50° C. mixture under vigorous stirring. After that the intensive smell of benzene sulfochloride has disappeared and a second phase has formed. This heavy oily phase is separated in the separatory funnel, imbibed using diethyl ether and dried over water-free sodium sulfate. Once the drying agent has been removed and the ether has been distilled off, 112 g of the product are obtained (yield: 88 based on the amino acetal used).

PREPARATION EXAMPLE 2

Preparation of 4-benzene sulfonamido butyraldehyde diethyl acetal 42 g 4-amino butyraldehyde diethyl acetal and 88 g benzene sulfochloride are processed as explained in Preparation Example 1. The reaction mixture is not clear from the very beginning and vigorous stirring is therefore indispensable. Methylene chloride is used for the extraction of the sulfonamide acetal. Yield: 86% based on the amino acetal used. The product will crystallize when standing for an extended time at room temperature; melting point: 109°–111°° C.; for further purification recrystallization from a 2:1 volume mixture of water and ethanol is possible.

PREPARATION EXAMPLE 3

Preparation of 4-methane sulfonamido butyraldehyde diethyl acetal 48.2 g 4-amino butyraldehyde diethyl acetal are dissolved in 48.2 g water-free pyridine at 20 ° C. under stirring in a three-necked flask, equipped with a thermometer, reflux condenser, tap funnel and magnetic stirrer. Subsequently, the mixture is cooled to 10° to 15° C. by means of external cooling and at these temperatures 34,6 g methane sulfochloride is added drop-wise at such a rate that the temperature of the reaction mixture does not rise beyond the given range. Subsequently, the mixture is heated to 40° to 50° C. for 1 hour and then stirred into 300 g ice water, to which 20 g of concentrated hydrochloric acid were added, under intensive stirring. The resulting substance is a two-phase, yellow-brown mixture, which is extracted with ether and further processed as explained in Preparation Example 1. Yield: 88% based on the amino acetal used.

PREPARATION EXAMPLE 4

Preparation of 4-(4-acetyl amino benzene sulfonamido) butyraldehyde diethyl acetal 48.2 g 4-amino butyraldehyde diethyl acetal are dissolved in 96.4 g water-free pyridine in a three-necked flask, equipped with a thermometer, reflux condenser and magnetic stirrer. The mixture is cooled to 10° to 15° C. and then 4-acetamido benzene sulfochloride is added in portions such that the temperature of the reaction mixture does not rise beyond the given range. Subsequently, the mixture is heated to 40° C. for 2 hours and then added drop-wise to 300 g ice water, to which 40 g of concentrated hydrochloric acid were added, under intensive stirring. The resulting substance is a two-phase, yellow-brown mixture, which is extracted with ether and further processed as explained in Preparation Example 1. The oil remaining after the removal of the ether crystallizes after standing for a while. Yield: 83% based on the amino acetal used; melting point: 99°–101° C.

PREPARATION EXAMPLE 5

Preparation of 4-toluene sulfonamido acetaldehyde dimethyl acetal

The process is carried out as explained in Preparation Example 4 using 52.5 g amino acetaldehyde dimethyl acetal, 96 g 4-toluene sulfochloride and 140 g water-free pyridine. In this case, the ice water contains 100 g concentrated hydrochloric acid. Oily product; yield: 82% based on the amino acetel used.

PREPARATION EXAMPLE 6

50 g Mowiol 5/88® (vinyl alcohol/vinyl acetate copolymer of the Hoechst company comprising 79 wt. % vinyl alcohol units having an $M_w$: 37,000 g/mole) are stirred for 15 hours at 55 to 60° C. in a mixture of 270 g n-propanol and 150 g water in a three-necked flask, equipped with a thermometer, reflux condenser, tap funnel and magnetic stirrer. Then, 7.5 g concentrated hydrochloric acid are added. Subsequently, a solution of 20.4 g butyraldehyde and 10 g sulfonamido acetel from Preparation Example 1 in 30 g n-propanol is added drop-wise within 1 hour and the mixture is stirred another 4 hours at the same temperature. Subsequently, it is cooled to room temperature and a solution of 8 g sodium carbonate in 15 ml water is added, causing the pH value to set at 7. Then, the reaction product is precipitated by stirring the mixture into 3 l water while intensively stirring. The product is separated, intensively washed with water and dried for two days at approx. 45° C. The yield is 92% based on the Mowiol 5/88® used. The obtained product is examined regarding its content of remaining vinyl alcohol units by means of common methods. The content is 21 wt. %.

PREPARATION EXAMPLE 7

Another sulfonamide polyvinyl acetel is produced by replacing Mowiol 5/88® with Mowiol 8/88® (vinyl alcohol/vinyl acetate copolymer of the Hoechst company comprising 79 wt. % vinyl alcohol units having an Mw: 67,000 g/mole) in Preparation Example 6 (yield: 90% based on the Mowiol 8/88® used; content of vinyl alcohol units: 22 wt. %).

PREPARATION EXAMPLE 8

50 g Mowiol 5/88® are dissolved in 500 ml water and stirred for 10 hours at room temperature in a three-necked flask, equipped with a stirrer, reflux condenser and tap funnel. Then, 7.5 g concentrated hydrochloric acid and 0.2 g Dowfax XD 8390.00® (available from Dow Chemical) are added and the mixture is cooled to 10° C. by means of external cooling. Then, a solution of 12.8 g propionaldehyde and 18 g of the product from Preparation Example 4 in 60 g n-propanol is added drop-wise within 1.5 hours. Subsequently, the cooling is removed, the temperature is allowed to rise to room temperature under stirring and the reaction mixture is stirred for another 4 hours. After this, a solution of 3 g sodium hydrate in 50 ml water is added, stirred for 30 minutes, the separated precipitation is sucked off, washing with water takes place and drying for two days at approx. 45° C. (yield: 89 % based on the Mowiol 5/88®, content of vinyl alcohol units: 28 wt. %).

PREPARATION EXAMPLE 9

A solution of 50 g Mowiol 18/88® ($M_w$: 130,000 g/mole, content of vinyl alcohol units: 79 wt. %) is prepared as described in Preparation Example 6. 6 g concentrated hydrochloric acid are added. Subsequently, 18.7 g butyraldehyde are added drop-wise at 55° to 60° C. within 30 minutes and the mixture is stirred for 2 hours. Then, a solution of 18 g sulfonamide acetal of Preparation Example 2 in 40 g n-propanol is added and the mixture is stirred for another 3 hours at the given temperature. Upon cooling, the reaction mixture is neutralized with a solution of 6.4 g sodium carbonate in 15 ml water and the polymeric binder is precipitated by stirring in 3 l water. It is sucked off, washed with water and dried at approx. 45° C. (yield: 90% based on the Mowiol 18/88® used, content of vinyl alcohol units: 22 wt. %).

PREPARATION EXAMPLE 10

50 g Mowiol 8/88® are dissolved in 350 g dimethyl sulfoxide in a three-necked flask, equipped with a thermometer, reflux condenser and magnetic stirrer and this solution is stirred for 14 hours at temperatures of approx. 60° C. Subsequently, 7.5 g concentrated hydrochloric acid are added, a solution of 13.5 g of the sulfonamide acetals from Preparation Example 5 in 30 g dimethyl sulfoxide is added drop-wise within 30 minutes and the mixture is stirred for another 2 hours. Then, 9.9 g acetal aldehyde dissolved in 20 g dimethyl sulfoxide is slowly added drop-wise and the reaction is completed by stirring for two hours. The polymeric binder is precipitated by stirring in 3 l water, in which 8 g soda have been dissolved, separated by sucking off and well washed with water. The product is dried as stated above (yield: 86% based on the Mowiol 8/88® used, content of vinyl alcohol units: 29 wt. %).

PREPARATION EXAMPLE 11

The process is carried out as explained in Preparation Example 6 using 50 g Mowiol 5/88®, 16 g butyraldehyde, 12.4 g of the sulfonamide acetal from Preparation Example 3 (35 g n-propanol for dissolving the sulfonamide acetal) and 7.5 g concentrated hydrochloric acid (yield: 89% based on the Mowiol 5/88® used, content of vinyl alcohol units: 30 wt. %).

PREPARATION EXAMPLE 12

The process is carried out as explained in Preparation Example 9 using 50 g Mowiol 5/88®, 11.6 g propionaldehyde, 31.1 g sulfonamide acetal from Preparation Example 5 (55 g n-propanol for dissolving the sulfonamide acetal) and 7.5 g concentrated hydrochloric acid (yield: 91% based on the Mowiol 5/88® used, content of vinyl alcohol units: 21 wt. %).

PREPARATION EXAMPLE 13

The process is carried out as explained in Preparation Example 8 using 50 g Mowiol 5/88®, 12.8 g propionaldehyde, 3.8 g butyraldehyde (aldehydes dissolved in 60 g n-propanol) and 7.5 g concentrated hydrochloric acid (yield: 91% based on the Mowiol 5/88® used, content of vinyl alcohol units: 29 wt. %).

EXAMPLE 1

A coating solution is prepared from the following components:

3.5 g sulfonamide polyvinyl acetal of Preparation Example 6

2.5 g of a polycondensation product from 1 mole 3-methoxy diphenylamine-4-diazonium sulfate and 1 mole 4,4'-bis-methoxymethyldiphenyl ether precipitated as mesitylene sulfonate 0.2 g Victoria blue BO 0.1 g phosphoric acid (85%).

These components are dissolved under stirring in 100 ml of a mixture comprising 45 parts by volume methanol 30 parts by volume methyl glycol 25 parts by volume methyl ethyl ketone.

After filtering the solution, it is applied to an electrochemically roughened and anodized aluminum foil that was subjected to an aftertreatment using polyvinyl phosphonic acid by means of common methods and the coating is dried for 4 minutes at 90° C. The weight of the printing layer amounts to approx. 1 g/m$^2$.

The printing layer is exposed under a silver film halftone step wedge having a tonal range of 0.15 to 1.95, wherein the density increments amount to 0.15, to give a negative model using a metal halogenide lamp (MH burner, available from W. Sack) of 300 mJ/cm$^2$.

The exposed coating is treated for 30 seconds with a developer solution comprising 3.4 parts by weight Rewopol NLS 28® (30% solution of sodium lauryl sulfate in water commercially available from REWO)

1.8 parts by weight 2-phenoxy ethanol 1.1 parts by weight diethanol amine 1.0 parts by weight Texapon 842® (42% solution of octyl sulfate in water available from Henkel)

0.6 parts by weight Nekal BX Paste® (sodium salt of an alkyl naphthalenesulfonic acid available from BASF)

0.2 parts by weight 4-toluene sulfonic acid 91.9 parts by weight water.

Then the developer solution is again rubbed over the surface for another 30 seconds using a tampon and then the entire plate is rinsed with water. After this treatment the exposed portions remain on the plate. For the assessment of its photosensitivity and ink receptivity, the plate is blackened in a wet state using a printing ink. The used products are PC 904® (available from Polychrome) and RC 43® (available from Hoechst).

The plate's ink receptivity is good for both printing inks and exposed microscopic lines are very well reproduced.

The gray wedge is completely covered up to step 2 and partially covered up to step 9.

The following is carried out to test the developability of the non-exposed coating and be able to compare it to other formulations: at intervals of 5 seconds strips of the coated aluminum foil are charged with the above developer solution using a pipette. After a duration of 30 seconds of the developer action on the first strip, the entire foil is rapidly and uniformly rinsed under a shower head. One half of the foil is subsequently blackened and the foil is dried. The duration of developer action is determined after which the emulsion was completely removed from the non-blackened half of the foil and/or after which no ink receptivity can be determined on the blackened half (hereinafter termed drop test). It amounts to 10 seconds in both cases.

For the preparation of a lithographic plate a printing layer is applied to the aluminum foil, as explained above, exposed, developed and after rinsing with water the developed plate is wiped and rubbed with an aqueous solution of 0.5% phosphoric acid and 6% gum arabic. The thus prepared plate is loaded in a sheet-fed offset printing machine and under normal printing conditions provides 100,000 copies of good quality. The plate could be used for more prints.

EXAMPLE 2

Example 1 is repeated, but instead of the sulfonamide polyvinyl acetal of Preparation Example 6 that of Preparation Example 7 is used and processed. The resulting printing layer results in a gray wedge completely covered up to step 3 and partially covered up to step 9 when blackened. No ink receptivity problems occur. The drop test is 10 seconds in both cases. A lithographic plate in a sheet-fed offset printing machine provides 140,000 copies.

EXAMPLE 3

The test of Example 1 is amended as follows: instead of the sulfonamide polyvinyl acetal of Preparation Example 6 that of Preparation Example 8 is used. The weight ratios of the composition of the coating solution and the further processing steps remain unchanged.

Upon blackening, the printing layers of this invention result in a gray wedge completely covered up to step 2 and partially covered up to step 8. Blackening takes place uniformly with both inks. The drop test is 5 seconds in both cases. A lithographic plate in a sheet-fed offset printing machine provides 130,000 copies.

EXAMPLE 4

A coating solution is prepared from the following components:

4.2 g sulfonamide polyvinyl acetal of Preparation Example 9

1.0 g of a polycondensation product from 1 mole 3-methoxy diphenylamine-4-diazonium sulfate and 1.2 mole formaldehyde precipitated as hexafluorophosphate 0.75 g Renol blue B2G® (Cu-phthalocyanine pigment preparation comprising polyvinyl butyral available from HOECHST)

0.1 g 4-phenyl azo diphenylamine 0.1 g phosphoric acid (85%).

and the solvent mixture Example 1 and is further processed as stated there.

The weight of the printing layer is approx. 1.1 g/m$^2$. The ink receptivity of the plate is good and exposed microscopic lines are very well reproduced. The gray wedge is completely covered up to step 4 and partially covered up to step 10. The drop test is 15 seconds for the non-blackened portion and 10 seconds for the blackened portion. The lithographic plates provide 100,000 copies of good quality. The plate could be used for more prints.

EXAMPLE 5

A coating solution is prepared from the following components:

4.1 g sulfonamide polyvinyl acetal of Preparation Example 11

1.1 g of a polycondensation product from 1 mole 3-methoxy diphenylamine-4-diazonium sulfate and 1 mole 4,4'-bis-methoxymethyldiphenyl ether precipitated as 4-tolylsulfonate 0.2 g OB 613® (Orient Chemical Industry Co.)

0.1 g phosphoric acid (85%)

and the solvent mixture from Example 1 and is further processed as stated there.

The drop test for the printing layers with this formulation is 10 seconds in both cases, the resulting printing layer results in a gray wedge completely covered up to step 2 and partially covered up to step 9. The finished lithographic plate is loaded in a sheet-fed offset printing machine and under normal printing conditions provides 140,000 copies of good quality.

EXAMPLE 6

A coating solution is prepared from the following components:

5.0 g sulfonamide polyvinyl acetal of Preparation Example 10

2.9 g of a 80% solution of an urethane acrylate prepared in methyl ethyl ketone by reacting 1-methyl-2,4-bis-isocyanato benzene (Oesmodur N 100® available from Bayer) comprising hydroxy ethyl acrylate and pentaerythritol triacrylate having a double-bond content of 0.5 double bonds/100 g when all isocyanate groups are completely reacted 1.4 g dipentaerythritol pentaacrylate 0.17 g 2-(4-methoxy naphthyl-1-yl)-4,6-bis-(trichloromethyl)-s-triazine 0.3 g polycondensation product from 1 mole 3-methoxy diphenylamine-4-diazonium sulfate and 1 mole 4,4'-bis-methoxymethyldiphenyl ether precipitated as mesitylene sulfonate 0.2 g Victoria blue BO 0.1 g phosphoric acid (85%).

These components are dissolved under stirring in 100 ml of a mixture comprising 30 parts by volume methyl glycol 45 parts by volume methanol 25 parts by volume methyl ethyl ketone.

After filtration, the solution is applied to an electrochemically toughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

Then, an oxygen-impermeable layer of 0.4 g/m² dry layer weight was applied analogously by applying a coating of a solution of the following composition:

50 g polyvinyl alcohol (Airvol 203® available from Airproducts; 12 wt. % residual acetyl groups)

170 g water.

Drying takes place for 5 minutes at 95° C.

The plate is exposed, developed, blackened and used for printing as described in Example 1. The drop test of the printing layer is 10 seconds in both cases. The plate'is ink receptivity is good and exposed microscopic lines are very well reproduced. The first step of the gray wedge is completely covered and the steps up to step 11 are partially covered.

The finished plate is loaded in a sheet-fed offset printing machine and under normal printing conditions provides 100,000 copies of good quality. The plate could be used for more prints.

EXAMPLE 7

A coating solution is prepared from the following components:

3.54 g sulfonamide polyvinyl acetel of Preparation Example 7

4.62 g of a 80% solution of an urethane acrylate prepared by reacting 1-methyl-2,4-bis-isocyanato benzene (Desmodur N 100® available from Bayer) comprising hydroxy ethyl acrylate and pentaerythritol triacrylate having a double-bond content of 0.5 double bonds/100 g when all isocyanate groups are completely reacted 0.17 g 2-(4-methoxy naphth-1-yl)-4,6-bis-(trichloromethyl)-1,3,5-triazine 0.16 g 4,4'-N,N-diethyl amino benzophenone 0.19 g 3-mercapto-1,2,4-triazol 0.12 g congo red 0.2 g leuco Crystal Violet.

These components are dissolved under stirring in 100 ml of a mixture comprising 35 parts by volume methyl glycol 25 parts by volume methanol 40 parts by volume methyl ethyl ketone.

After filtration, the solution is applied to an electrochemically toughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1.9 g/m².

Then, an oxygen-impermeable layer of 1.7 g/m² dry layer weight was applied analogously by applying a coating of a solution of the following composition:

50 g polyvinyl alcohol (Airvol 203® available from Airproducts; 12 wt. % residual acetyl groups)

270 g water.

Drying takes place for 5 minutes at 95° C.

The plate is exposed as described in Example 1; however, the amount of light is 20 mJ/m². Immediately upon exposure, the plate is heated to 95° C. for 1 minute in order to amplify the photo polymerization taking place. Developing and blackening takes place as described in Example 1.

The drop test of the printing layer is 10 seconds in both cases. The plate'is ink receptivity is good. The first step of the gray wedge is completely covered and the steps up to step 6 are partially covered.

The thus prepared plate is loaded in a sheet-fed offset printing machine and under normal printing conditions provides 100,000 copies of good quality. The plate could be used for more prints.

EXAMPLE 8

The test of Example 6 is amended as follows: instead of the sulfonamide polyvinyl acetal of Preparation Example 10 that of Preparation Example 11 is used. The weight ratios of the composition of the coating solution and the further processing steps including the preparation of the overcoating and processing remain unchanged.

The drop test of the printing layer is 10 seconds in both cases. The plate'is ink receptivity is good and exposed microscopic lines are very well reproduced. The second step of the gray wedge is completely covered and the steps up to step 11 are partially covered.

The thus obtained plate is loaded in a sheet-fed offset printing machine and under normal printing conditions provides 100.000 copies of good quality. The plate could be used for more prints.

EXAMPLE 9

The test of Example 4 is amended as follows: instead of the sulfonamide polyvinyl acetal of Preparation Example 9 that of Preparation Example 12 is used. The weight ratios of the composition of the coating solution and the further processing remain unchanged.

The printing layers of the invention with this formulation have a drop test of 10 seconds in both cases. The second step of the gray wedge is completely covered and the steps up to step 9 are partially covered. The finished plate is loaded in a sheet-fed offset printing machine and under normal printing conditions provides 130,000 copies of good quality.

Comparative Example 1

A coating solution is prepared from the following components:

3.4 g polyvinyl acetal of Preparation Example 13

2.5 g of a polycondensation product from 1 mole 3-methoxy diphenylamine-4-diazonium sulfate and 1 mole 4,4'-bis-methoxymethyldiphenyl ether precipitated as mesitylene sulfonate 0.2 g Victoria blue BO 0.1 g phosphonic acid (85%).

These components are dissolved in the solvent mixture of Example 1 and further processed as stated there. The weight of the printing layer is approx. 1 g/m².

The plate is exposed, developed and blackened as described in Example 1.

The drop test of the printing layer is 30 seconds for the non-blackened area and 35 seconds for the blackened area. In the blackened state, the first step of the gray wedge is completely covered and the steps up to step 8 are partially covered. A lithographic plate in a sheet-fed offset printing machine provides 100,000 copies.

In Example 3, the vinyl alcohol/vinyl acetate copolymers modified according to this invention show a considerably improved developability as well as improved sensitivity and consistency in the number of prints produced.

What is claimed is:

1. A photosensitive composition comprising:
   (i) a diazonium polycondensation product or
   a free radical polymerizable system consisting of photoinitiators and free radical polymerizable components or
   a hybrid system consisting of a diazonium polycondensation product and a free radical polymerizable system consisting of photoinitiators and free radical polymerizable components, and
   (ii) a binder
   containing the units A, B, C and D, wherein A is present in an amount of 0.5 to 15 wt. % and is of the formula

B is present in an amount of 10 to 35 wt. % and is of the formula

C is present in an amount of 10 to 50 wt. % and is of the formula

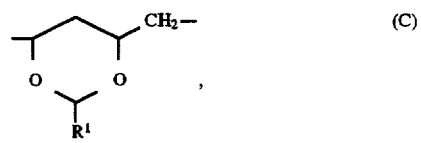

wherein $R^1$ is methyl, ethyl, propyl or isopropyl, and D is present in an amount of 25 to 70 wt. % and is of the formula

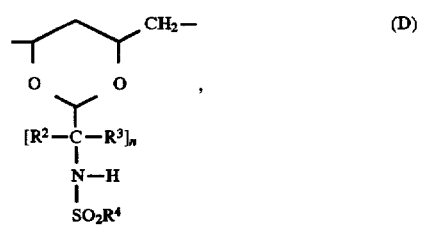

wherein n is an integer of from 1 to 3 and $R^2$, $R^3$ are hydrogen or methyl, and $R^4$ is alkyl, alkyl or aryl.

2. The composition of claim 1, wherein the photosensitive component is a polycondensation product of 3-methoxy-diphenylamine-4-diazonium sulfate and 4,4'-bis-methoxymethyldiphenyl ether precipitated from aqueous solution as organic sulfonate, tetrafluoroborate, hexafluorophosphate, hexafluoroantimonate or hexafluoroarsenate.

3. The composition of claim 1, wherein the photosensitive component is a radical-forming photoinitiator or mixtures of photoinitiators and coinitiators rendering the mixture sensitive to the wavelengths from 300 to 800 nm as well as radically polymerizable components with unsaturated groups.

4. The composition of claim 1 further comprising an—exposure indicator,—a—dye for increasing the contrast of the image as well as—an—acid for stabilizing the photosensitive composition.

* * * * *

UNITED STATES PATENT AND TRADEMARK OFFICE
CERTIFICATE OF CORRECTION

PATENT NO. : 5,698,360
DATED      : December 16, 1997
INVENTOR(S): Timpe et al.

It is certified that error appears in the above-identified patent and that said Letters Patent is hereby corrected as shown below:

Column 16, line 41,
"alkyl, alkyl, or aryl" should read
--alkyl, aralkyl, or aryl--.

Signed and Sealed this

Seventh Day of July, 1998

Attest:

BRUCE LEHMAN

*Attesting Officer*                 Commissioner of Patents and Trademarks